United States Patent
Tatah

[11] Patent Number: 5,563,508
[45] Date of Patent: Oct. 8, 1996

[54] NON-CONTACT RESISTIVITY MEASUREMENT APPARATUS AND METHOD USING FEMTOSECOND LASER PULSES TO CREATE AN ELECTRON FLOW

[75] Inventor: Abdelkrim Tatah, Arlington, Mass.

[73] Assignee: Panasonic Technologies, Princeton, N.J.

[21] Appl. No.: 414,539

[22] Filed: Mar. 31, 1995

[51] Int. Cl.⁶ ................................................ G01R 31/28
[52] U.S. Cl. ........................................ 324/158.1; 324/752
[58] Field of Search ........................... 324/71.5, 73.1, 324/158.1, 765, 750, 752, 751, 72.5, 719, 722; 356/237, 400, 401; 364/550

[56] References Cited

U.S. PATENT DOCUMENTS

| | | |
|---|---|---|
| 4,772,846 | 9/1988 | Reeds .................................... 324/751 |
| 4,866,660 | 9/1989 | Merkelo et al. ....................... 356/256 |
| 4,931,704 | 6/1990 | Alfano et al. .......................... 315/384 |
| 4,980,566 | 12/1990 | Heilweil ................................. 250/339 |
| 5,007,059 | 4/1991 | Keller et al. ........................... 372/18 |
| 5,017,863 | 5/1991 | Mellitz .................................... 324/751 |
| 5,054,027 | 10/1991 | Goodberlet et al. .................. 372/25 |
| 5,095,487 | 3/1992 | Meyerhofer et al. ................. 372/23 |
| 5,119,383 | 6/1992 | Duling, III et al. .................... 372/18 |
| 5,132,824 | 7/1992 | Patel et al. ............................. 359/78 |
| 5,175,664 | 12/1992 | Diels et al. ............................ 361/213 |
| 5,265,107 | 11/1993 | Delfyett, Jr. ........................... 359/245 |
| 5,323,260 | 6/1994 | Alfano et al. .......................... 359/244 |
| 5,365,366 | 11/1994 | Kafka et al. ........................... 359/330 |
| 5,371,368 | 12/1994 | Alfano et al. .......................... 250/341.1 |
| 5,377,043 | 12/1994 | Pelouch et al. ....................... 359/326 |
| 5,442,297 | 8/1995 | Verkuil .................................... 324/752 |
| 5,475,319 | 12/1995 | Hirae et al. ............................ 324/71.5 |

*Primary Examiner*—Vinh P. Nguyen
*Attorney, Agent, or Firm*—Ratner & Prestia

[57] ABSTRACT

Apparatus and method for measuring the resistivity of a material without contacting or damaging the material, using a current and voltage meter connected to a first probe and a second probe. The probes are placed adjacent the material and in spaced relation to the material, a first ultraviolet laser beam having femtosecond pulses is focused onto the first probe such that the first probe emits electrons toward the material, and a second ultraviolet laser beam having femtosecond pulses is focused onto the material such that the material emits electrons toward the second probe. A voltage and a closed current loop are thus created. The current and voltage meter measures the current and voltage to obtain current and voltage readings, and the current and voltage readings are used to determine the resistivity of the material.

8 Claims, 3 Drawing Sheets

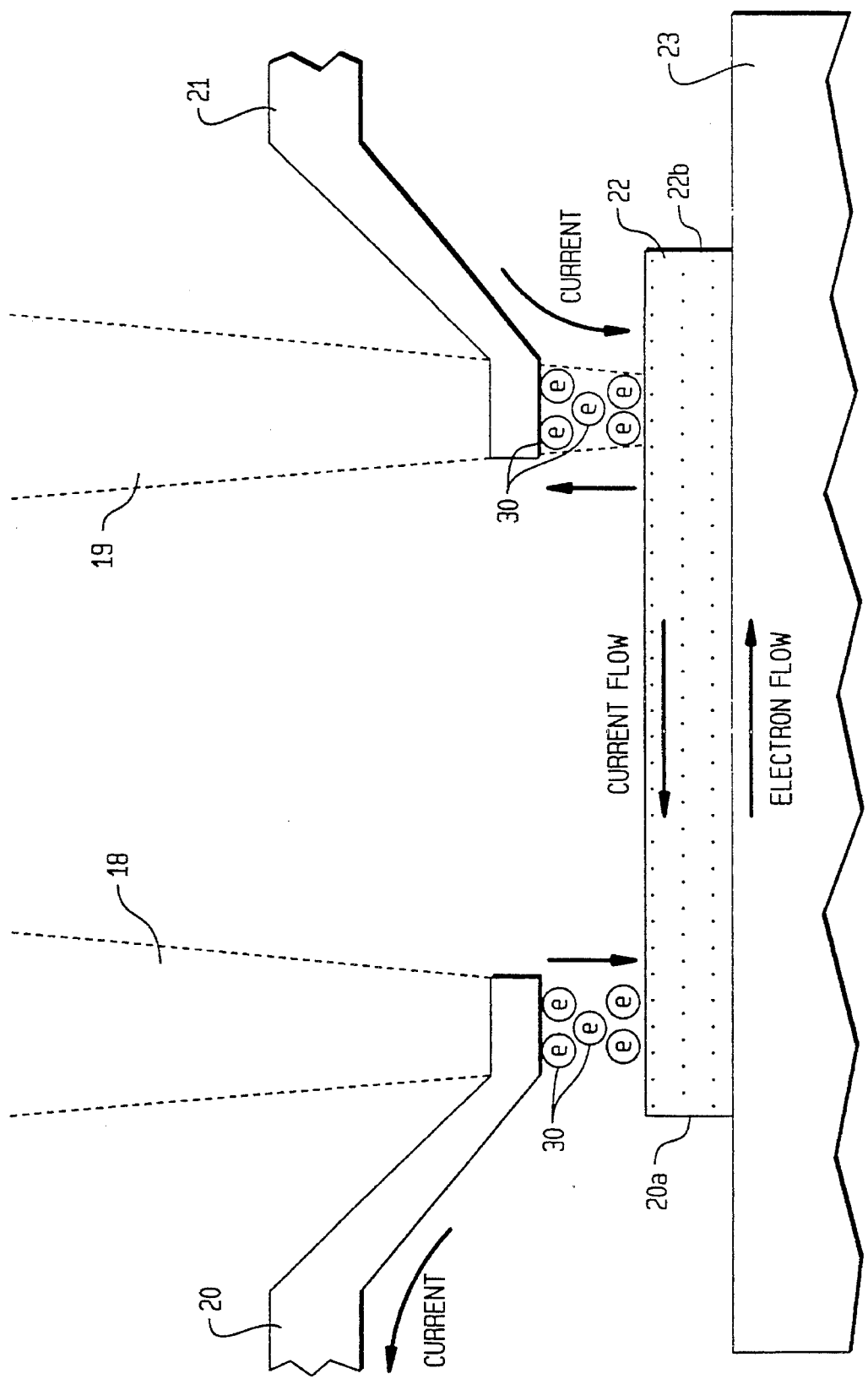

NON-CONTACT RESISTIVITY MEASUREMENT APPARATUS AND METHOD USING FEMTOSECOND LASER PULSES TO CREATE AN ELECTRON FLOW

FIELD OF THE INVENTION

This invention relates to measuring the resistivity of materials and, more particularly, to a non-contact resistivity measurement system using femtosecond laser beam pulses.

BACKGROUND OF THE INVENTION

The resistivity of electrical components is an important property. In the electronics field, precise knowledge of the resistivity of various materials or components is often critical to the determination of whether and how the materials or components will be used.

Conventional resistivity measurement techniques involve the placement of two electrical probes on the component to be measured. The probes are generally connected by an ammeter or other measuring device that measures the current traveling through the material between the probes This measurement of current flow I, resulting from the application of a known voltage V, is used to determine the resistivity of the component according to the well-known formula R=V/I.

An essential feature of conventional measurement techniques is thus contact between the probes and the material that is being measured. In many situations, such contact is undesirable.

For example, in the microelectronics area, it is often necessary to measure the resistivity of metal lines that have been deposited on substrates. These metal lines are used for connecting circuits in personal computer boards and multi-chip modules, among other uses. In order to measure the resistivity of the metal lines using conventional techniques, it is necessary to contact the probes with the line. If the metal line is not very firmly attached to the substrate, and often even if it is, the probe may scratch away the metal or otherwise damage the metal line. Scratches and other forms of damage to a metal line may interfere with the electrical connection provided by the metal line. This produces undesirable performance of the component on which the line is deposited. If the damage from the probe is severe enough, the metal line may have to be redeposited.

A measurement system capable of providing a good resistivity measurement for electrical components, such as metal lines on a substrate, or other materials, without damaging the components or materials, is desirable.

SUMMARY OF THE INVENTION

The present invention provides a method for measuring the resistivity of a material without contacting or damaging the material, using a current and voltage meter connected to a first probe and a second probe. The method involves placing the first probe adjacent to the material and in spaced relation to the material, placing the second probe adjacent to the material and in spaced relation to the material, focusing a first ultraviolet laser beam having short optical pulses onto the first probe such that the first probe emits electrons toward the material, and focusing a second ultraviolet laser beam having short optical pulses onto the material such that the material emits electrons toward the second probe. This creates a voltage and a closed current loop wherein current flows from the second probe, through the material, through the first probe, and through the current and voltage meter. The method of the present invention also includes measuring the current and voltage using the current and voltage meter to obtain current and voltage readings, and using the current and voltage readings to determine the resistivity of the material.

The present invention also provides apparatus for measuring the resistivity of a material without contacting or damaging the material. The apparatus includes a first probe member placed adjacent to the material and in spaced relation to the material, a second probe member placed adjacent to the material and in spaced relation to the material, a femtosecond laser that emits an ultraviolet laser beam having femtosecond pulses which is split into two beams, one of which is focused onto the first probe to cause the first probe to emit electrons toward the material, the other of which is focused onto the material to cause the material to emit electrons toward the second probe. A voltage and a closed current loop are generated, the current loop having current flowing from the second probe, through said material, through said first probe, and through a current and voltage meter connecting the first and second probes. The current and voltage meter measures the current and voltage to obtain current and voltage readings which determine the resistivity.

BRIEF DESCRIPTION OF THE DRAWINGS

FIG. 3 is an enlarged side plan view of a portion of the exemplary resistivity measurement system of FIG. 1.

DETAILED DESCRIPTION OF THE INVENTION

The term "non-contact" as used herein means that the probes of the measurement device do not touch the material the resistivity of which is being measured. Using the non-contact resistivity measurement system and method of the present invention, it is possible to obtain accurate resistivity measurements of electrical components or other materials without damaging the components or materials.

Figure 1:
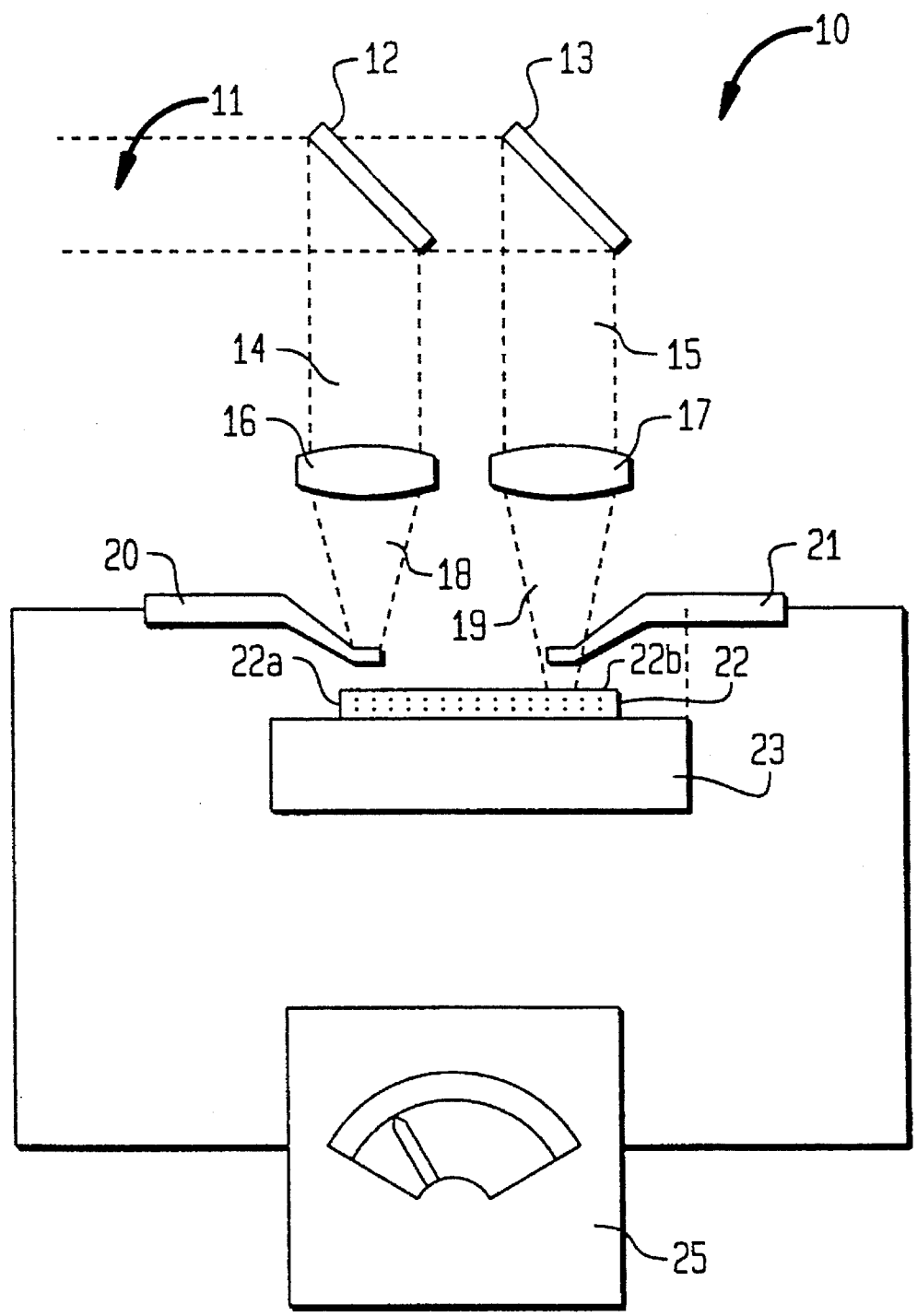
FIG. 1 is a side plan view of an exemplary resistivity measurement system according to the present invention.

FIG. 1 depicts an exemplary non-contact resistivity measurement system 10 according to the present invention. In FIG. 1, beam 11 is a laser beam having femtosecond pulses. Beam 11 may be generated by any femtosecond laser known in the art. Suitable femtosecond lasers include the Sunami model Ti:sapphire laser available from Spectra-Physics, Mountain View, Calif., and the Fant excimer femtosecond laser and amplifier system available from Lamda Physics in Germany. The former model is suitable for generating infrared or ultraviolet laser beams, the latter for ultraviolet laser beams. In the illustrated embodiment, beam 11 is in the ultraviolet range.

A beam splitter 12 reflects a portion of beam 11 to create reflected beam 14. The remainder of beam 11 passes through beam splitter 12 to mirror 13. Mirror 13 reflects the remainder of beam 11 down as reflected beam 15.

Reflected beams 14 and 15 are directed (by the position of beam splitter 12 and mirror 13, respectively) onto lenses 16 and 17, respectively. Lens 16 focuses reflected beam 14 into focused beam 18. Lens 17 focuses reflected beam 15 into focused beam 19.

A first point probe 20 is disposed above a first side 22a of a metal line 22 deposited on a substrate 23. A second point probe 21 is disposed above a second side 22b of metal line 22. Suitable probes are available from Alessi, Irvine, Calif.

First point probe 20 and second point probe 21 are electrically connected through a multimeter 25. Current and voltage flowing between first point probe 20 and second point probe 21 produces readings on multimeter 25 indicative of the current and voltage. Multimeter 25 may be any multimeter known in the art. A suitable multimeter is available from Keithley Instruments. Because of the rapid femtosecond pulse rate of the beams, however, it may be necessary to use an oscilloscope rather than a multimeter in order to measure the current and voltage produced, if a multimeter cannot make the readings fast enough. Alternatively, separate voltage and current meters may be used, or an ohmmeter may be used.

Focused beam 18 is focused on first point probe 20. Focused beam 19 is focused, in the illustrated embodiment, through a hole in second point probe 21 onto metal line 22.

Figure 2:
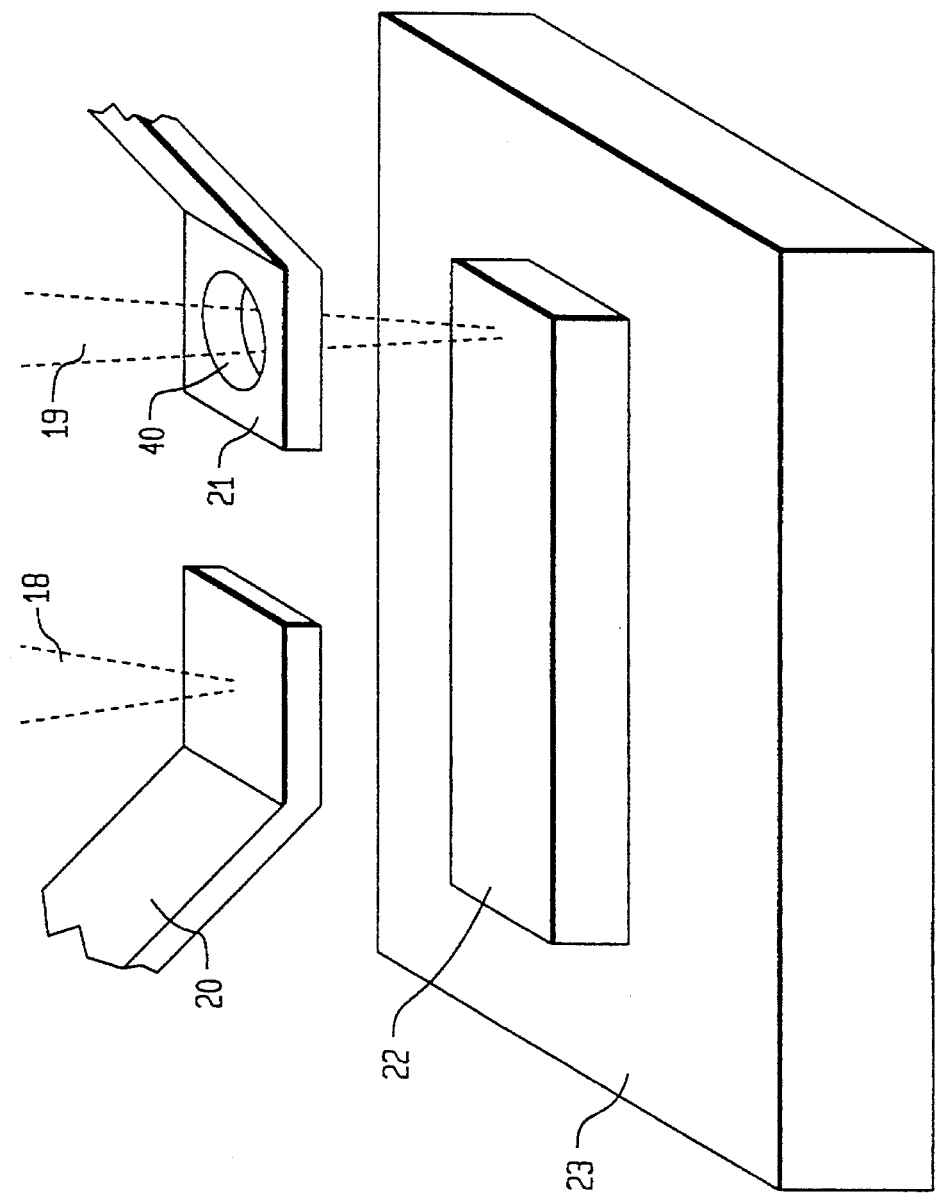
FIG. 2 is an enlarged perspective view of a portion of the exemplary resistivity measurement system of FIG. 1.

FIG. 2 is an enlarged perspective view of a portion of system 10. As shown in FIG. 2, focused beam 19 passes through a hole 40 in second point probe 21. Hole 40 may be laser-machined through second point probe 21, or formed by other techniques known in the art.

Focused beam 19 focuses onto metal line 22 as shown in FIG. 2. Alternative methods of focusing focused beam 19 onto metal line 22 without contacting second point probe 21 may be used. For example, focused beam 19 may be angled or directed to pass to the side of second point probe 21. Passing focused beam 19 to the side of second point probe 21 may be difficult where second point probe 21 is very close to metal line 22. The point is that one of the focused beams, focused beam 18, lands on the first point probe 20, and a second focused beam, focused beam 19, lands on metal line 22.

FIG. 3 is an enlarged side-plan view of a portion of system 10. As shown in FIG. 3, focusing focused beam 18 onto first point probe 20 causes the emission of electrons 30. Focused beam 18 has femtosecond pulses as in beam 11. Beam 11, and hence reflected beams 14 and 15 and focused beams 18 and 19 are in the ultraviolet range. Focusing a laser beam having femtosecond pulses in the ultraviolet range onto a metal such as point probe 20 results in the emission of electrons by two phenomena: thermionic emission and photoelectric effect. A discussion of thermionic emission is presented in a paper by D. M. Riffe et al. entitled "Time Resolved Electron Emission and Non-Thermal Ion Emission from Gold Excited by Intense Femtosecond Pulses," which appears in the digest of papers presented at the "Ultrafast Phenomena" conference held in CA in May 1994. That paper is incorporated herein by reference for its teaching on thermionic emission.

The present invention takes advantage of both of the two above-mentioned phenomena. The short wavelength of the ultraviolet light having femtosecond pulses contains high energy that facilitates electron emission from the metal probe.

As focused beam 18 lands on point probe 20, electrons 30 are emitted from first point probe 20. Electrons 30 travel toward and impinge on metal line 22 on first side 22a. Electrons 30 then travel through metal line 22 at a known rate, obtainable, for example, from solid state physics textbooks such as Kittel, *Solid State Physics.*

As focused beam 18 is focused onto first point probe 20, focused beam 19 is focused onto second side 22b of metal line 22. There may be a time delay between the time when focused beam 18 is focused onto first point probe 20 and the time when focused beam 19 is focused onto second side 22b of metal line 22. This time delay may be coordinated so that focused beam 19 is focused onto second side 22b of metal line 22 at the same time that electrons 30 emitted from first point probe 20 reach second side 22b of metal line 22.

By the same phenomena of thermionic emission and photoelectric effect, focusing focused beam 19 onto second side 22b of metal line 22 causes electrons 30 to be emitted from second side 22b of metal line 22. Electrons 30 travel toward and impinge on second point probe 21. The rate at which electrons 30 are emitted from first point probe 20 may differ from the rate at which and from electrons 30 are emitted from metal line 22.

By the emission of electrons 30 from first point probe 20 to metal line 22 and from metal line 22 to second point probe 21, a situation is created where electrons 30 travel from first point probe 20 to metal line 22, through metal line 22, and from metal line 22 to second point probe 21. This results in an electron flow from left to right across FIG. 3; that is, from first side 22a to second side 22b.

By this flow of electrons, a current and voltage due to a potential difference is generated within metal line 22. The current travels from right to left across FIG. 3; that is, from second side 22b to first side 22a. The current travels from metal line 22 through first point probe 20, through the electrical connection between point probe 20 and multimeter 25, through multimeter 25, through the electrical connection between multimeter 25 and second point probe 21, through point probe 21, back into metal line 22, and so on. A closed loop current flow is thus generated.

The currant flowing through multimeter 25 and the voltage across first point probe 20 and second point probe 21 produces a current reading and voltage reading on multimeter 25. These readings are measures of current flow I and the voltage V and can be used to determine the resistivity of metal line 22 using the formula $R=V/I$.

There may be a resistance in the closed current loop of the exemplary embodiment of the present invention as electrons 30 travel through the air at first side 22a and second side 22b of metal line 22. This resistance will be constant for fixed distances with given materials. It may therefore be accounted for by calibrating the system to a material with known resistivity. Alternatively, a local vacuum may be used to remove the air desistance.

The present invention provides a non-contact system for measuring the resistivity of electrical components or other materials. Using this invention, it is possible to obtain accurate resistivity measurements without damaging the sample for which the resistivity is being measured.

While the present invention has been described in terms of exemplary embodiments, it is contemplated that it may be practiced as outlined above with modifications that are within the spirit and scope of the appended claims.

What is claimed:

1. A method for measuring the resistivity of a material without contacting or damaging the material, using means for measuring current and voltage connected to a first probe and a second probe, comprising the steps of:

(a) disposing said first probe adjacent said material and in spaced relation thereto;

(b) disposing said second probe adjacent said material and in spaced relation thereto;

(c) focusing a first ultraviolet laser beam having short optical pulses onto said first probe such that said first probe emits electrons toward said material; and (d) focusing a second ultraviolet laser beam having short optical pulses onto said material such that said material emits electrons toward said second probe, thereby creating a voltage across said first probe and said second probe and creating a closed current loop wherein current flows from said second probe, through said material, through said first probe, and through said means for measuring current and voltage.

2. A method as claimed in claim 1 further comprising the stems of measuring said current and said voltage using said means for measuring current and voltage to obtain current and voltage readings, and using said current and voltage readings to determine the resistivity of the material.

3. A method as claimed in claim 1 wherein said means for measuring current and voltage is a multimeter.

4. A method as claimed in claim 1 wherein said means for measuring current and voltage is an oscilloscope.

5. Apparatus for measuring the resistivity of a material without contacting or damaging the material, comprising:

(a) a first probe member disposed adjacent said material and in spaced relation thereto;

(b) a second probe member disposed adjacent said material and in spaced relation thereto;

(c) means for emitting electrons from said first probe member toward said material; and (d) means for emitting electrons from said material toward said second probe member;

wherein voltage and closed current loop are generated, said current loop having current flowing from said second probe member, through said material, through said first probe member, and through a connection between said first probe member and said second probe member.

6. Apparatus as claimed in claim 5 further comprising means for measuring said voltage and said current to obtain voltage and current readings, wherein said voltage and current readings determine said resistivity.

7. Apparatus as claimed in claim 5 wherein said means for measuring said voltage and said current is a multimeter.

8. Apparatus as claimed in claim 5 wherein said means for measuring said voltage and said current is an oscilloscope.

* * * * *